United States Patent
Li et al.

(10) Patent No.: US 11,337,310 B1
(45) Date of Patent: May 17, 2022

(54) PRINTED CIRCUIT BOARD WITH LATERAL METALLIZATION GROOVE AND PROCESSING METHOD THEREOF

(71) Applicant: INNO CIRCUITS LIMITED, Suining (CN)

(72) Inventors: Qinghua Li, Huizhou (CN); Renjun Zhang, Ankang (CN); Yangqiang Sun, Suining (CN); Zhiqiang Hu, Daying County (CN); Yugui Mou, Zigong (CN)

(73) Assignee: INNO CIRCUITS LIMITED, Suining (CN)

( * ) Notice: Subject to any disclaimer, the term of this patent is extended or adjusted under 35 U.S.C. 154(b) by 0 days.

(21) Appl. No.: 17/520,722

(22) Filed: Nov. 8, 2021

(30) Foreign Application Priority Data

Mar. 30, 2021 (CN) .......................... 202110338851.7

(51) Int. Cl.
*H05K 3/10* (2006.01)
*H05K 7/14* (2006.01)
*H05K 3/18* (2006.01)
*H05K 3/00* (2006.01)

(52) U.S. Cl.
CPC .......... *H05K 3/107* (2013.01); *H05K 3/0047* (2013.01); *H05K 3/18* (2013.01); *H05K 7/1418* (2013.01); *H05K 7/1489* (2013.01)

(58) Field of Classification Search
CPC ........ H05K 3/101; H05K 3/107; H05K 3/045; H05K 3/1258; H05K 3/0047; H05K 3/18; H05K 7/1418; H05K 7/1489

USPC .................... 361/756–759, 801–802
See application file for complete search history.

(56) References Cited

U.S. PATENT DOCUMENTS

| | | | | |
|---|---|---|---|---|
| 4,020,535 | A * | 5/1977 | Cuneo | H05K 3/0002 445/49 |
| 4,836,789 | A * | 6/1989 | Rudy, Jr | H05K 7/1418 211/94.01 |
| 5,396,401 | A * | 3/1995 | Nemoz | H05K 7/1461 361/690 |
| 5,652,557 | A * | 7/1997 | Ishikawa | H01P 3/081 333/246 |
| 5,718,789 | A * | 2/1998 | Gebhardt | H05K 3/045 156/154 |
| 6,084,175 | A * | 7/2000 | Perry | H01L 31/1804 136/256 |

(Continued)

*Primary Examiner* — Tuan T Dinh

(57) ABSTRACT

A printed circuit board with a lateral metallization groove and a processing method thereof, relates to the field of printed circuit boards with lateral metallization grooves, processing technologies thereof and batch processing methods. The processing method includes the following steps: step S01, drilling and milling grooves; step S02, performing metallization treatment; step S03, laying an outer layer circuit; step S04, performing pattern plating; step S05, performing first milling grooves; step S06, etching an outer layer; step S07, performing surface treatment after performing solder resist printing and character printing; step S08, forming to mill off connections of a processing side; step S09, performing second milling grooves to form a through groove. The present disclosure can implement: a long side of the printed circuit board can be directly connected with the ground wire rather than independently installing the ground wire; a small space is occupied and conveniently replacement.

8 Claims, 6 Drawing Sheets

(56) References Cited

U.S. PATENT DOCUMENTS

| | | | | |
|---|---|---|---|---|
| 6,166,919 A | * | 12/2000 | Nicolici | H05K 9/0062 |
| | | | | 361/753 |
| 7,307,851 B2 | * | 12/2007 | Dimarco | H05K 7/1407 |
| | | | | 361/752 |
| 7,608,919 B1 | * | 10/2009 | Bernstein | H01L 25/0655 |
| | | | | 257/685 |
| 2005/0172998 A1 | * | 8/2005 | Gee | H01L 31/022425 |
| | | | | 136/261 |
| 2011/0146782 A1 | * | 6/2011 | Gabor | H01L 31/1804 |
| | | | | 136/256 |

* cited by examiner

PRINTED CIRCUIT BOARD WITH LATERAL METALLIZATION GROOVE AND PROCESSING METHOD THEREOF

BACKGROUND

1. Technical Field

The present disclosure generally relates to the technical field of printed circuit boards and processing methods thereof, and especially relates to a printed circuit board with a lateral metallization groove, a processing method and a batch processing method thereof, and a high-density multi-module control cabinet for industrial or computer networks, with a plurality of printed circuit boards with lateral metallization grooves.

2. Description of Related Art

After a conventional printed circuit board is assembled, the printed circuit board is generally fixed on a shell of a device by fixing screws into non-metallization holes of the printed circuit board, or a metal piece is welded on the printed circuit board, and then the printed circuit board is assembled on the shell of the device through the metal piece.

However, the above two installation ways occupy large spaces, with a fussy assembly mode, and additional ground wires need to be installed, rather than being applied to high-density multi-module industrial control cabinets or computer network control cabinets.

SUMMARY

The technical object is to solve at least one of the above shortcomings of the related art, for example, the printed circuit board in the related art needs to be additionally provided with a ground wire and has a complicated assembly mode.

In order to achieve the above object, in an aspect, a processing method of a printed circuit board with a lateral metallization groove according to an embodiment of the present disclosure is provided and includes the following steps: step S01, drilling and milling grooves in a semi-finished printed circuit board with an inner layer circuit thereof, wherein, the step of milling the grooves is to mill off contact parts between two long sides of the semi-finished printed circuit board, and a processing side, except connections of the processing side, to form two first-type grooves at each of the two long sides, or two first-type grooves and at least one second-type groove; and wherein the first-type groove is formed by one side surface of the semi-finished printed circuit board, one side surface of the processing side, and one side surface of connections of a processing side, and the second-type groove is formed by one side surface of the semi-finished printed circuit board, one side surface of the processing side, and two side surfaces of connections of the processing side; step S02, performing metallization treatment, so that a part of the first-type groove positioned on the long side of the semi-finished printed circuit board, is metallized to form a first-type metallization groove, a part of the second-type groove positioned on the long side of the semi-finished printed circuit board, is metallized to form a second-type metallization groove, and the holes that have drilled are metallized to form metallization holes, both the first-type metallization groove and the second-type metallization groove electrically connected with a board-surface electrical ground layer of the semi-finished printed circuit board; step S03, laying an outer layer circuit on the semi-finished printed circuit board that has obtained in the step S02; step S04, performing pattern plating on the outer layer circuit and the first and second metallization grooves; step S05, performing first milling grooves, wherein a first-type concave groove is milled on the side surface of the first-type metallization groove, and a second-type concave groove is milled on the side surface of the second-type metallization groove, and both the first-type concave groove and the second-type concave groove, with the same preset width along a thickness direction of the long side and/or the same preset depth along a vertical direction of the long side, are arranged on a center line of the side surface where the long side of the semi-finished printed circuit board is positioned; step S06, etching an outer layer of the semi-finished printed circuit board that is obtained in the step S05; step S07, performing surface treatment on the semi-finished printed circuit board that is obtained in the step S06, after performing solder resist printing and character printing thereof; step S08, forming the semi-finished printed circuit board that is obtained in the step S07, to mill off the connections of the processing side; and step S09, performing second milling grooves, wherein a third-type concave groove is milled on the side surface of the semi-finished printed circuit board formed after the connections of the processing side is milled off in the step S08, the third-type concave groove, with the preset width along the thickness direction of the long side and/or the preset depth along the vertical direction of the long side, is arranged on the central line of the side surface where the long side of the semi-finished printed circuit board is positioned, all the third-type concave groove, the first-type concave groove and the second-type concave groove are matched to form a through groove.

In another aspect, a printed circuit board with a lateral metallization groove according to an embodiment of the present disclosure is manufactured by the above processing method.

In another aspect, a high-density and multi-module control cabinet for industrial or computer networks according to an embodiment of the present disclosure is provided. The control cabinet includes a subrack and a plurality of printed circuit boards with lateral metallization grooves mentioned above. The subrack includes a ground wire, and a plurality of pairs of metal strips, each pair of the plurality of pairs of metal strips connected with two through grooves of the printed circuit board with lateral metallization grooves, to form a slide rail connection therebetween.

Compared with the related art, the present disclosure provides the advantages as below: (1) the electrical group layer of the printed circuit board can be directly connected with the ground wire, rather than independently installing the ground wire; (2) an occupied space is small, a replacement is convenient, and the printed circuit board can be applied to equipments such as a high-density multi-module industrial control cabinet or a computer network control cabinet; (3) the processing technology is efficient and convenient.

Figure 1:
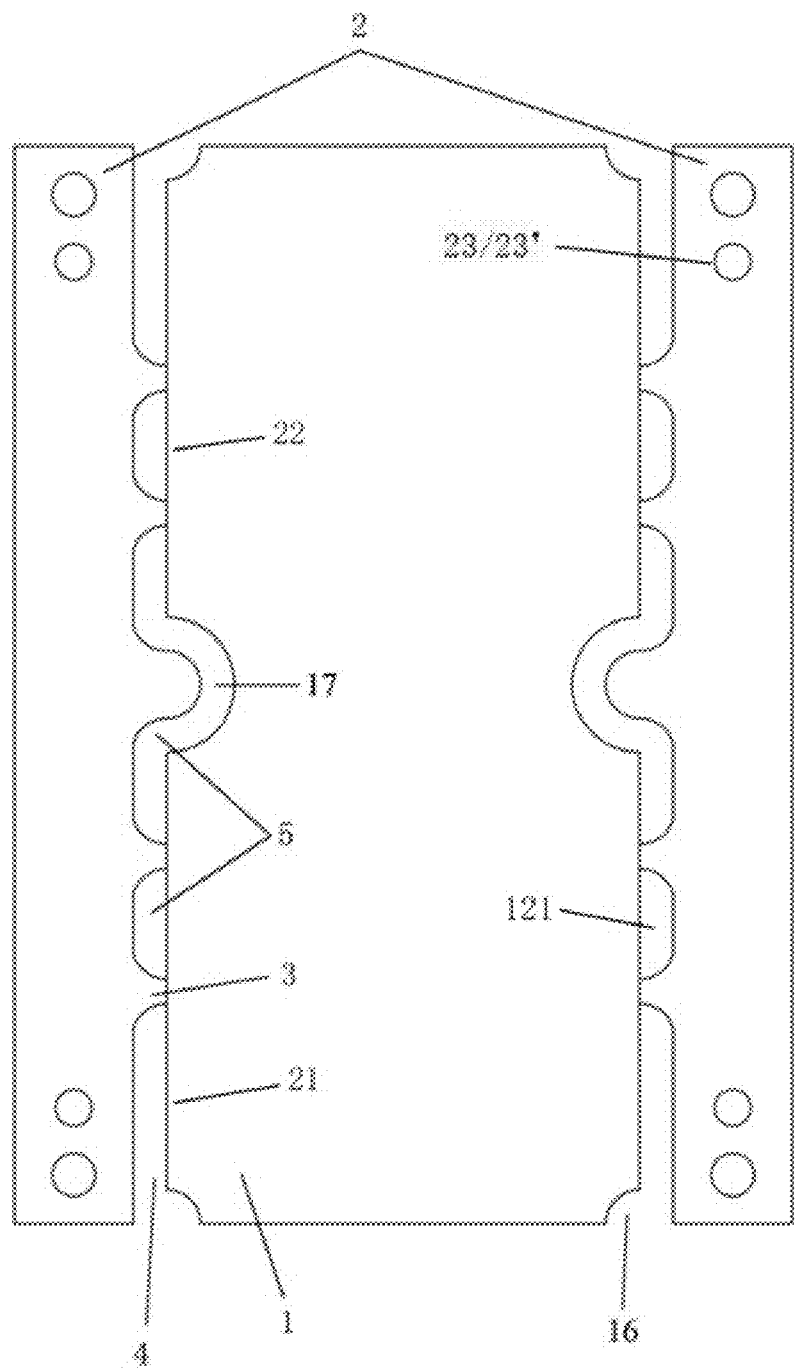
FIG. 1 is a schematic view of a first semi-finished printed circuit board in accordance with an embodiment of the present disclosure.

Element labels according to the embodiment of the present disclosure shown as below:

first semi-finished printed circuit board 1, processing side 2, connection 3, first-type groove 4, second-type groove 5, second semi-finished printed circuit board 6, through groove 7, subrack 8, metal strip 9, printed circuit board 10, upper metal strip 11, lower metal strip 12, cutter head 13, blade 131, connecting portion 14, cutter handle 15, first-type concave groove 16, second-type concave groove 17, first-type metallization groove 21, second-type metallization groove 22, hole 23, metallization hole 23', third-type concave groove 24, contact part 121, inner layer circuit 61, outer layer circuit 62, board-surface electrical ground layer 63, outer layer 64.

DETAILED DESCRIPTION

Hereinafter, a printed circuit board with lateral metallization grooves and a processing method thereof according to the present disclosure will be described in detail in combination with exemplary embodiments. Herein, terms "first", "second", "third" etc, are only configured to conveniently describe and distinct the present disclosure, rather than be intended to indicating or implying relative importance or strict orders of elements described in the detailed description.

In an embodiment of the present disclosure, the processing method of the printed circuit board with lateral metallization grooves can be implemented by the following steps:

step S01, drilling and milling grooves.

Specifically, a semi-finished printed circuit board with an inner layer circuit 61 formed thereon is drilled and milled. The step of drilling and the milling grooves can be performed without strict sequences, for example, the drilling holes and the milling grooves can be performed sequentially or simultaneously. The semi-finished printed circuit board can be obtained by working procedures of cutting, laying inner layer circuits 61, etching an inner layer, browning, pressing and so on. The milling the grooves is specifically to mill off contact parts 121 between two long sides of the semi-finished printed circuit board, and a processing side, except connections of the processing side, to form two first-type grooves at each of the two long sides, or two first-type grooves 4 and at least one second-type groove 5; and wherein the first-type groove 4 is formed by one side surface of the semi-finished printed circuit board, one side surface of the processing side, and one side surface of connections of the processing side, and the second-type groove 5 is formed by one side surface of the semi-finished printed circuit board, one side surface of the processing side, and two side surfaces of connections of the processing side.

In addition, the milling grooves in the step S01 can be implemented by an I-type milling cutter which includes a cylinder-like cutter head with a uniform blade diameter and a height not less than a thickness of the semi-finished printed circuit board. Programs of milling the grooves can be set by programming. For example, travelling along the long side and avoiding the connections of the processing side, to form the first-type groove and/or the second-type groove.

step S02, performing metallization treatment.

Specifically, performing metallization treatment on the semi-finished printed circuit board that has obtained in the step S01, so that a part of the first-type groove 4 positioned on the long side of the semi-finished printed circuit board, is metallized to form a first-type metallization groove 21, a part of the second-type groove 5 positioned on the long side of the semi-finished printed circuit board, is metallized to form a second-type metallization groove 22, and holes 23 that have drilled are metallized to form metallization holes 23', both the first-type metallization groove 21 and the second-type metallization groove 22 electrically connected with a board-surface electrical ground layer 63 of the semi-finished printed circuit board. The metallization treatment can be a deposition process. In addition, the metallization treatment can also set a copper plating process after the copper deposition process.

step S03, laying an outer layer circuit 62.

Specifically, laying the outer layer circuit 62 on the semi-finished printed circuit board that has obtained in the step S02. Laying the outer layer circuit 62 can be implemented by a conventional process.

step S04, performing pattern plating.

Performing the pattern plating on the outer layer circuit 62, and the first-type and second-type metallization grooves 21, 22, so as to form an etching protection layer. For example, the pattern plating can be a tin plating process for patterns.

step S05, performing first milling grooves.

Specifically, a first-type concave groove is milled on the side surface of the first-type metallization groove, and a second-type concave groove is milled on the side surface of the second-type metallization groove, and both the first-type concave groove and the second-type concave groove, with the same preset width along a thickness direction of the long side and/or the same preset depth along a vertical direction of the long side, are arranged on a center line of the side surface where the long side of the semi-finished printed circuit board is positioned.

In addition, the first milling grooves in the step S05 can be implemented by a T-type milling cutter. For example, the T-type milling cutter includes a truncated-cone-like cutter head 13 with a height of 0.2~0.8 times the thickness of the semi-finished printed circuit board that has obtained in the step S04. Thus, the first-type concave groove 16 and the second-type concave groove 17 with a thickness of 0.2~0.8 times the thickness of the semi-finished printed circuit board can be obtained. A depth of the first-type concave groove 16 and the second-type concave groove 17 can be determined by a diameter of the truncated cone-like cutter head 13 of the T-type milling cutter extending into the long side. Programs of the first milling grooves can be set by programming. For example, the first-type concave groove 16 and/or the second-type concave groove 17 are formed by travelling along the long side and avoiding the connections of the processing side. In addition, the T-type milling cutter also includes a connecting portion 14 and a cutter handle 15 sequentially connected with the truncated cone-like cutter head 13, the truncated-cone-like cutter head 13 including blades 131 uniformly distributed in a circumferential direction thereof, and a diameter of the circumference composed of the blades 131 greater than a diameter of the connecting portion.

Step S06, etching an outer layer 64.

Performing etching treatment on the outer layer 64 of the semi-finished printed circuit board processed that is obtained in the step S05. The etching treatment can be implemented by using a conventional process.

Step S07, performing surface treatment after performing solder resist printing and character printing After the solder resist and the character are printed on the semi-finished printed circuit board processed that is obtained in the step S06, surface treatment is then performed. The solder resist printing, the character printing and the surface treatment can be implemented through conventional processes.

Step S08, forming.

Forming the semi-finished printed circuit board that is obtained in the step S07, to mill off the connections of the processing side.

Step S09, performing second milling grooves.

Specifically, a third-type concave groove 24 is milled on the side surface of the semi-finished printed circuit board formed after the connections of the processing side is milled off in the step S08, the third-type concave groove 24, with the preset width along the thickness direction of the long side and/or the preset depth along the vertical direction of the long side, is arranged on the central line of the side surface where the long side of the semi-finished printed circuit board is positioned, all the third-type concave groove 24, the first-type concave groove 16 and the second-type concave groove 17 are matched to form a through groove 7. The through groove 7 can be taken as a sliding rail of the metal strip of the subrack.

In addition, the second milling grooves in the step S09 can be implemented by the above T-type milling cutter. A depth of the third-type concave groove can be determined by the diameter of the truncated cone-like cutter head of the T-type milling cutter extending into the long side. Programs of the second milling grooves can be set by programming. For example, the third-type concave groove is formed by travelling along the long side at the connections of the processing side.

In another embodiment of the present disclosure, the processing method of the printed circuit board with lateral metallization grooves can include the following steps: cutting material→laying inner layer circuits→etching inner layers→browning→pressing→drilling and milling grooves→copper deposition (metallization)→copper plating→laying outer layer circuits→pattern plating→first milling grooves→etching outer layers→solder resist printing→character printing→surface processing→forming→second milling grooves→testing→finished product inspection.

That is, in the present embodiment, the processing method of the printed circuit board with lateral metallization grooves provides that the step of drilling and milling grooves is arranged between the step of pressing and the step of copper deposition; the step of first milling grooves is arranged between the step of pattern plating and the step of etching outer layers; and the step of second milling grooves is arranged between the step of forming and the step of testing. As for the step of drilling and milling grooves, it can first perform the step of drilling grooves, and then perform the step of milling grooves; or the step of milling grooves can be performed first, and then followed by the step of drilling grooves.

The process of milling grooves in the step of drilling and milling grooves, can be: milling off the contact parts between two long sides of the semi-finished printed circuit board, and the processing side, except the connections of the processing side, to form two first-type grooves at each of the two long sides, or two first-type grooves and at least one second-type groove. Furthermore, two sides of the printed circuit board or the semi-finished printed circuit board with a longer length are the long sides of the printed circuit board or the semi-finished printed circuit board. Referring to FIG. 1, the first semi-finished printed circuit board 1 is processed to the step of drilling and milling grooves, according to the above-mentioned steps from the step of cutting material to the step of pressing. The process of milling grooves is to mill off the contact parts between the two long sides of a first semi-finished printed circuit board 1 and the processing side 2 except the connections 3 of the processing side, so that two first-type grooves 4 and three second-type grooves 5 are formed at the two long sides, respectively. The step of milling grooves can be implemented by a milling cutter with a constant diameter, such as the milling cutter with the cylindrical cutter head.

In the step of copper deposition, performing copper deposition on the semi-finished printed circuit board after the step of drilling and milling grooves is completed. The part of the first-type groove positioned on the long side of the semi-finished printed circuit board can be metalized by the step of copper deposition, to form a first-type metallization groove, the part of the second-type groove positioned on the long side of the semi-finished printed circuit board can be metalized by the step of copper deposition, to form a second-type metallization groove, and a hole that is obtained in the step of drilling and milling grooves can be metalized by the step of copper deposition, to form a metallization hole. The step of copper deposition is performed to implement both the first-type metallization groove and the second-type metallization groove to electrically connect with a board-surface electrical ground layer of the semi-finished printed circuit board. The board-surface electrical ground layer is a place where the printed circuit board or the semi-finished printed circuit board is conductive with an electrical ground layer on the board surface thereof. Specifically, the first-type metallization groove can be formed by performing copper deposition on upper, lower, and side surfaces of a portion of the first-type groove that is located at the long side of the semi-finished printed circuit board, and can be in a strip shape. The second-type metallization groove can be formed by performing copper deposition on the upper, lower and side surfaces of the portion of the second-type groove that is located at the long side of the semi-finished printed circuit board, and can also be in the strip shape.

In the step of copper plating, copper plating treatment is performed on the first-type metallization groove, the second-kind metallization groove and the metallization hole, so as to strengthen conductions between the first-type and second-type metallization grooves and the electrical ground layer, and strengthen the metallization hole, accordingly.

Performing pattern plating after performing the step of laying the outer layer circuit. Specifically, the outer layer circuit and the first-type and second-type metallization grooves are performed tin plating treatment to ensure that the first-type and second-type metallization grooves remain in electrical connection with the board-surface electrical ground layer even after performing the subsequent step of etching outer layers. In addition, the step of performing pattern plating can also perform tin plating treatment only on the outer layer circuit, a portion of the first-type metallization groove other than the first-type groove, and a portion of the second-type metallization groove other than the second-type groove.

The step of performing first milling grooves can be: a first-type concave groove is milled on the side surface of the first-type metallization groove, and a second-type concave groove is milled on the side surface of the second-type metallization groove, and both the first-type concave groove and the second-type concave groove, with the same preset depth along the vertical direction of the long side, are arranged on the center line of the side surface where the long side of the semi-finished printed circuit board is positioned.

Figure 4:
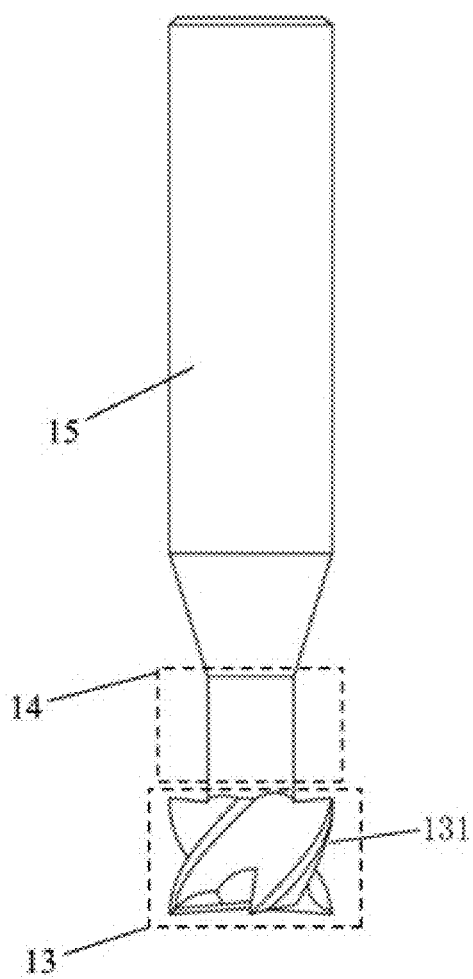
FIG. 4 is a schematic view of a T-type milling cutter for milling the printed circuit board in accordance with an embodiment of the present disclosure.
Figure 5:
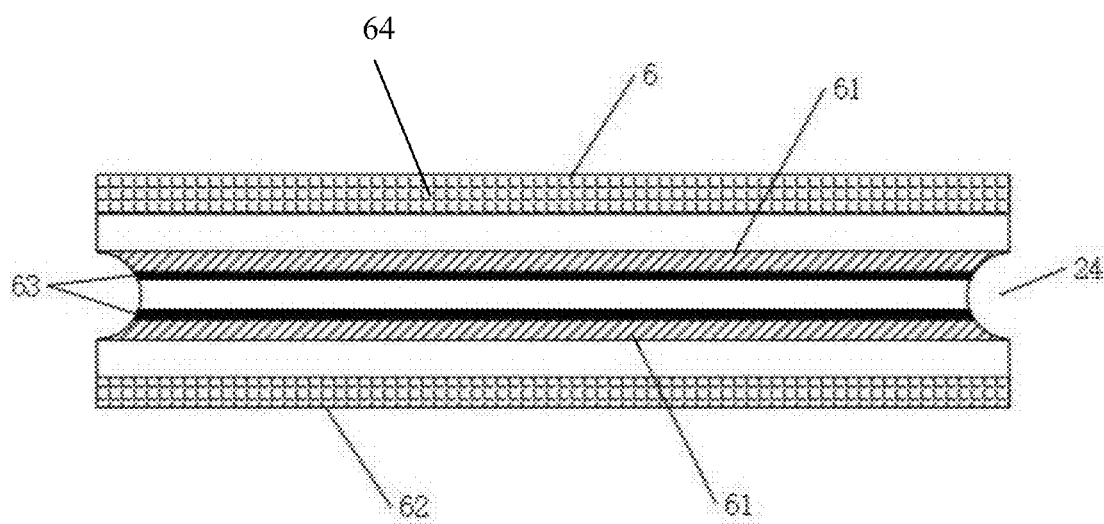
FIG. 5 is a cross-sectional view of the second semi-finished printed circuit board of FIG. 2.
Figure 6:
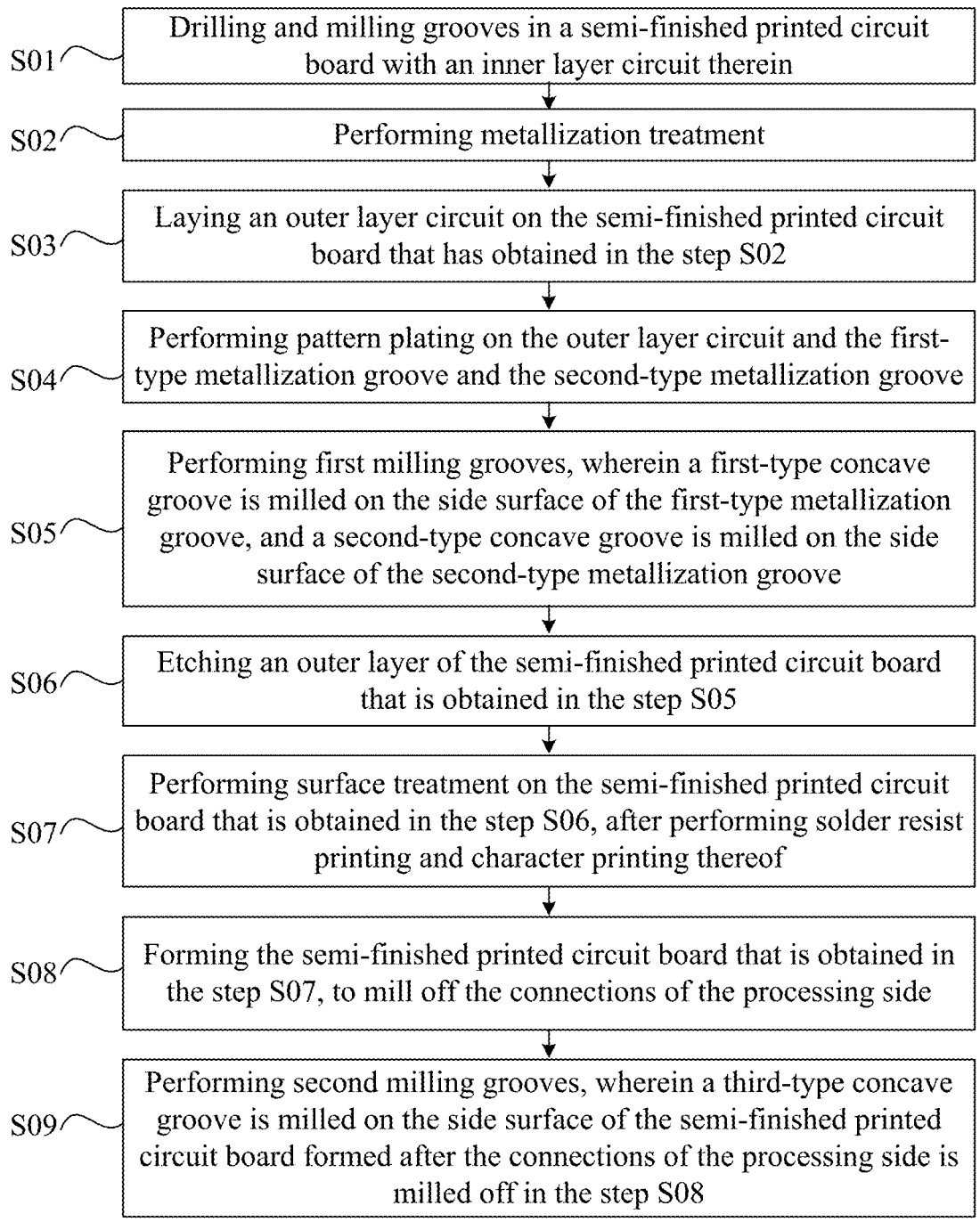
FIG. 6 is a flowchart of a processing method of a printed circuit board with a lateral metallization groove in accordance with an embodiment of the present disclosure.

Furthermore, the step of performing first milling grooves can be implemented by using the T-type milling cutter which includes the truncated-cone-like cutter head, a connecting portion and a cutter handle sequentially connected with the truncated-cone-like cutter head. The truncated-cone-like cutter head includes blades uniformly distributed in a circumferential direction thereof, and a diameter of the circumference composed of the blades greater than a diameter of the connecting portion. Referring to FIG. 4, a maximum outer diameter of the truncated-cone-like cutter head 13 is greater than a diameter of the connecting portion 14, and a transition portion with gradually decreasing diameters can be arranged between the cutter handle 15 and the connecting portion 14. Parts of the cutter head that radially projects beyond the connecting portion are used to form the first-type groove and the second-type groove. A height of the cutter head corresponds to a width of the first-type groove and the second-type groove, and a diameter difference between the cutter head and the connecting portion corresponds to a maximum depth of the first-type groove and the second-type groove.

The step of etching outer layers can etch away warped copper skin on the side surface of the semi-finished printed circuit board caused by performing the step of first milling grooves. A tin plating layer formed by the step of performing pattern plating can prevent the copper covered by the tin plating layer from being etched.

Figure 2:
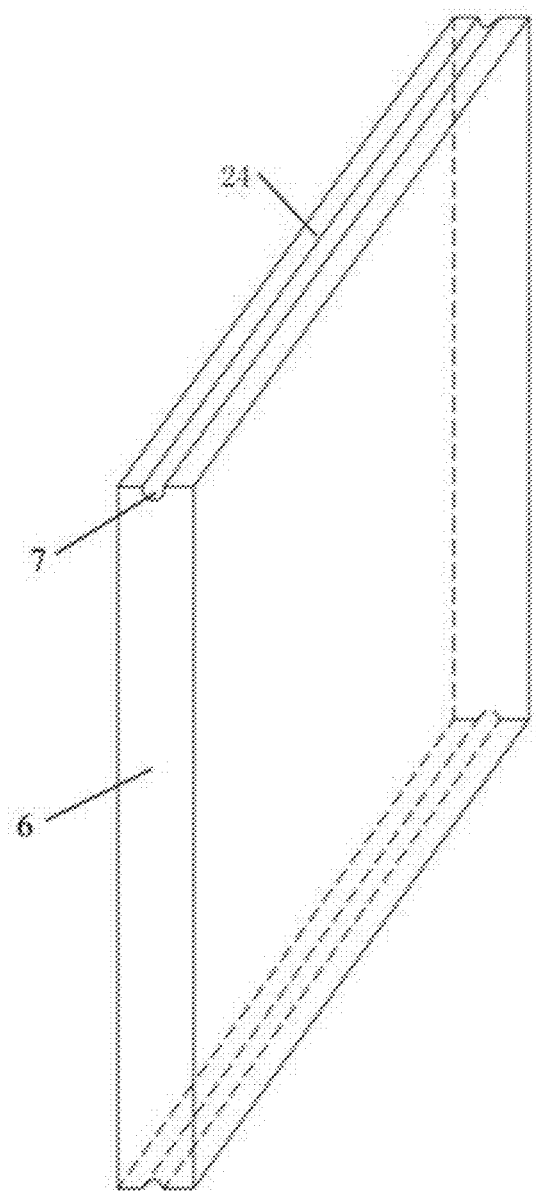
FIG. 2 is a perspective view of a second semi-finished printed circuit board in accordance with an embodiment of the present disclosure.

The step of performing second milling grooves can be: a third-type concave groove is milled on the side surface of the semi-finished printed circuit board formed after the connections of the processing side is milled off in the step of forming; the third-type concave groove, with the preset depth along the vertical direction of the long side, is arranged on the central line of the side surface of the long side of the semi-finished printed circuit board. The third-type concave groove can connect any two adjacent first-type concave grooves and/or second-type concave grooves located on the same long side, so as to form the through groove on the long side. Referring to FIG. 2, a second semi-finished printed circuit board 6 forms a through groove 7 after the second semi-finished printed circuit board 6 is performed the step of second milling grooves thereof. The through groove 7, with the preset depth along the vertical direction of the long side, is arranged on the central line of the side surface where the long side of the second semi-finished printed circuit board 6 is positioned.

The T-type milling cutter can be used in the step of performing second milling grooves.

In addition, when a concave position is formed on the side surface of the long side of the semi-finished product printed circuit board, the step of performing first milling grooves is omitted for the concave position. That is, the concave position can be performed copper plating for metallization, rather than forming the first-type groove and the second-type groove. For example, the concave position can be formed by one or more of the steps of cutting material, drilling and milling grooves. The concave position includes a first-type concave position and a second-type concave position. The first-type concave position is a surface existed on the first-type groove 4, recessed inwardly from the long side of the printed circuit board, and the second-type concave position is a surface existed on the second-type groove 5, recessed inwardly from the long side of the printed circuit board. That is to say, when the first-type concave position and/or the second-type concave position are formed on the side surface of the long side of the semi-finished printed circuit board, the first-type concave groove 16, the second-type concave groove 17 and the third-type concave groove 24 can be in the same straight line, although the through grooves formed by the first-type concave groove 16, the second-type concave groove 17 and the third-type concave groove 24 are not connected, they can still be taken as the sliding rail of the metal strips of the subrack.

In another embodiment of the present disclosure, the processing method of the printed circuit board with lateral metallization grooves can include the following steps: forming a plurality of semi-finished printed circuit boards by performing the steps below: cutting material→laying inner layer circuits→etching inner layers→browning→pressing; subsequently, overlapping the plurality of semi-finished printed circuit boards, and then performing the below steps: drilling and milling grooves→copper deposition (i.e. hole metallization)→copper plating; then, disassembling the plurality of overlapped semi-finished printed circuit boards, and performing the below steps: layering outer layer circuits→pattern plating→first milling grooves; subsequently, intensively performing etching treatment on outer layers; then, respectively performing the below steps: solder resist printing→character printing→surface processing→forming→second milling grooves→testing→finished product inspection. Thus, the processing efficiency is improved and the cost is reduced.

In another embodiment of the present disclosure, the processing method of the printed circuit board with lateral metallization grooves can include the following steps:

A splicing board is obtained by reserving the processing side on four sides of each semi-finished printed circuit board during assembly, and the splicing board is formed by splicing a plurality of semi-finished printed circuit boards (such as 4 or 6) that are positioned on the same horizontal plane;

disassembling the splicing board into a plurality of independent semi-finished printed circuit boards with the processing side, after performing the below steps on the splicing board: cutting material→laying inner layer circuits→etching inner layers→browning→pressing→drilling holes in the step S01;

The printed circuit board with lateral metallization grooves can be obtained by performing drilling the holes in the step S01, and the steps S02 to S09.

In another embodiment of the present disclosure, a high-density and multi-module control cabinet for industrial or computer networks includes: the subrack and the plurality of printed circuit boards with lateral metallization grooves mentioned above. The subrack includes a ground wire and a plurality of pairs of metal strips, each pair of the plurality of pairs of metal strips connected with two through grooves of the printed circuit board with the lateral metallization grooves to form a slide rail connection therebetween. Each pair of the plurality of pairs of metal strips is arranged parallel to each other. For example, each pair of metal strips can be arranged in parallel with each other along an up-down direction or a left-right direction, for example, a pair of metal strips can be composed of an upper (left) metal strip and a lower (right) metal strip, so that the plurality of printed circuit boards with lateral metallization grooves are correspondingly overlapped into the subrack in an up-down or left-right arrangement mode, therefore, the industrial control cabinet or the control cabinet for computer networks with a small occupation space, high density and multi-module can be obtained.

Figure 3:
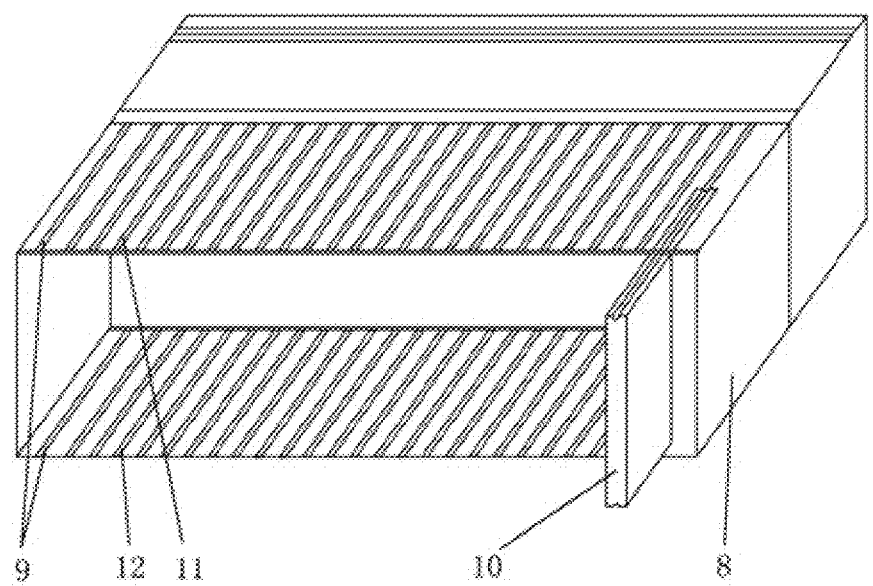
FIG. 3 is a schematic view of connecting a printed circuit board to a subrack in accordance with an embodiment of the present disclosure.

Referring to FIG. 3, a distance between the through grooves on the two long sides of the printed circuit board 10 is equal to a distance between the pair of metal strips 9 of the subrack 8, that is, equal to a distance between the upper metal strip 11 and the lower metal strip 12. The printed circuit board 10 can be slidably clamped between the pair of metal strips 9 of the subrack 8, and the board-surface electrical ground layer of the printed circuit board 10 is connected with the pair of metal strips 9 of the subrack 8 through the through grooves. That is, the electrical ground layer of the printed circuit board 10 can be connected with the upper metal strip 11 and the lower metal strip 12 through the first-type metallization groove and the second-type metallization groove. The electrical ground layer of the printed circuit board is connected with the ground wire (such as the shell) of the subrack, which solves the problem that the assembly mode of the printed circuit board is complicated and the ground wire needs to be additionally installed during assembly. Furthermore, the subrack 8 can assemble the plurality of printed circuit boards simultaneously, to implement high-density and multi-module functions, and any printed circuit board can be directly replaced after a fault occurs, so as to solve the problems of large space occupation and difficult replacement and maintenance in the related art.

In summary, the present disclosure provides the advantages as below:

(1) the electrical group layer of the printed circuit board can be directly connected with the ground wire rather than independently installing the ground wire;

(2) an occupied space is small, a replacement is convenient, and the printed circuit board can be applied to equipments such as a high-density multi-module industrial control cabinet or a computer network control cabinet; and (3) the processing technology is efficient and convenient.

Although the features and elements of the present disclosure are described in connection with the exemplary embodiments and the accompanying drawings, each feature or element can be used alone or in other various combinations within the principles of the present disclosure to the full extent indicated by the broad general meaning of the terms in which the appended claims are expressed. Any variation or replacement made by one of ordinary skill in the related art without departing from the spirit of the present disclosure shall fall within the protection scope of the present disclosure.

What is claimed is:

1. A processing method of a printed circuit board with a lateral metallization groove comprising the following steps:

step S01, drilling and milling grooves in a semi-finished printed circuit board with an inner layer circuit therein, wherein, the step of milling the grooves is to mill off contact parts between two long sides of the semi-finished printed circuit board, and a processing side, except connections of the processing side, to form two first-type grooves at each of the two long sides, or two first-type grooves and at least one second-type groove; and wherein the first-type groove is formed by one side surface of the semi-finished printed circuit board, one side surface of the processing side, and one side surface of connections of the processing side, and the second-type groove is formed by one side surface of the semi-finished printed circuit board, one side surface of the processing side, and two side surfaces of connections of the processing side;

step S02, performing metallization treatment, so that a part of the first-type groove positioned on the long side of the semi-finished printed circuit board, is metallized to form a first-type metallization groove, a part of the second-type groove positioned on the long side of the semi-finished printed circuit board, is metallized to form a second-type metallization groove, and holes that have drilled are metallized to form metallization holes, both the first-type metallization groove and the second-type metallization groove electrically connected with a board-surface electrical ground layer of the semi-finished printed circuit board;

step S03, laying an outer layer circuit on the semi-finished printed circuit board that has obtained in the step S02;

step S04, performing pattern plating on the outer layer circuit and the first-type metallization groove and the second-type metallization groove;

step S05, performing first milling grooves, wherein a first-type concave groove is milled on the side surface of the first-type metallization groove, and a second-type concave groove is milled on the side surface of the second-type metallization groove, both the first-type concave groove and the second-type concave groove, with the same preset width along a thickness direction of the long side and/or the same preset depth along a vertical direction of the long side, arranged on a center line of the side surface where the long side of the semi-finished printed circuit board is positioned;

step S06, etching an outer layer of the semi-finished printed circuit board that is obtained in the step S05;

step S07, performing surface treatment on the semi-finished printed circuit board that is obtained in the step S06, after performing solder resist printing and character printing thereof;

step S08, forming the semi-finished printed circuit board that is obtained in the step S07, to mill off the connections of the processing side; and step S09, performing second milling grooves, wherein a third-type concave groove is milled on the side surface of the semi-finished printed circuit board formed after the connections of the processing side is milled off in the step S08, the third-type concave groove, with the preset width along the thickness direction of the long side and/or the preset depth along the vertical direction of the long side, arranged on the central line of the side surface where the long side of the semi-finished printed circuit board is positioned, all the third-type concave groove, the first-type concave groove and the second-type concave groove matched to form a through groove.

2. The processing method as claimed in claim 1, wherein an I-type milling cutter is used in the step S01 for milling the grooves, and a T-type milling cutter is used in the steps S05 and S09 for milling the grooves, the I-type milling cutter comprising a cylinder-like cutter head, with a uniform blade diameter and a height not less than the thickness of the semi-finished printed circuit board, and the T-type milling cutter comprising a truncated-cone-like cutter head with a height of 0.2~0.8 times the thickness of the semi-finished printed circuit board that has obtained in the step S04.

3. The processing method as claimed in claim 2, wherein the T-type milling cutter further comprises a connecting portion and a cutter handle sequentially connected with the truncated-cone-like cutter head, the truncated-cone-like cutter head comprising blades uniformly distributed in a circumferential direction thereof, and a diameter of the circumference composed of the blades greater than a diameter of the connecting portion.

4. The processing method as claimed in claim 1, wherein the step S02 is implemented by performing copper deposition treatment, and the step S04 is implemented by performing tin plating treatment.

5. A batch processing method of printed circuit boards with lateral metallization grooves configured to simultaneously process a plurality of semi-finished printed circuit boards by using the processing method as claimed in claim 4, wherein the batch processing method is performed by overlapping the plurality of semi-finished printed circuit boards, and then performs the steps S01 and S02; disassembling the plurality of semi-finished printed circuit boards that have overlapped, to perform the steps S03, S04 and S05; collectively performing the step S06 on the plurality of semi-finished printed circuit boards; next, performing the steps S07, S08 and S09 on each of the plurality of semi-finished printed circuit boards, respectively.

6. A printed circuit boards with a lateral metallization groove is obtained by the processing method as claimed in claim 4.

7. A high-density and multi-module control cabinet for industrial or computer networks comprising a subrack and a plurality of printed circuit boards with lateral metallization grooves as claimed in claim 6, the subrack comprising a ground wire and a plurality of pairs of metal strips, each pair of the plurality of pairs of metal strips connected with two through grooves of the printed circuit board with the lateral metallization grooves, to form a slide rail connection therebetween.

8. The control cabinet as claimed in claim 7, wherein each pair of the plurality of pairs of metal strips is arranged parallel to each other.

* * * * *